United States Patent [19]
Jeong et al.

[11] Patent Number: 5,303,001
[45] Date of Patent: Apr. 12, 1994

[54] ILLUMINATION SYSTEM FOR HALF-FIELD DYSON STEPPER

[75] Inventors: Hwan J. Jeong, Los Altos, Calif.; Shafer David R., Fairfield, Conn.

[73] Assignee: Ultratech Stepper, Inc.

[21] Appl. No.: 994,239

[22] Filed: Dec. 21, 1992

[51] Int. Cl.$^5$ .................................................. G03B 27/42
[52] U.S. Cl. .................................................. 355/53; 355/1; 355/67
[58] Field of Search ........................... 355/1, 53, 67, 77

[56] References Cited

U.S. PATENT DOCUMENTS

| | | | |
|---|---|---|---|
| 4,742,376 | 5/1988 | Phillips | 355/77 |
| 4,899,195 | 2/1990 | Gotoh | 355/77 |
| 4,964,705 | 10/1990 | Markle | 350/442 |
| 5,003,345 | 3/1991 | Markle | 355/53 |
| 5,028,955 | 7/1991 | Hayashida et al. | 355/53 |
| 5,040,882 | 8/1991 | Markle | 359/727 |
| 5,150,173 | 9/1992 | Isobe et al. | 356/401 |
| 5,164,794 | 11/1992 | Markle | 356/394 |
| 5,168,021 | 12/1992 | Arai et al. | 430/22 |
| 5,168,304 | 12/1992 | Hattori | 355/53 X |
| 5,229,811 | 7/1993 | Hattori et al. | 355/53 X |

Primary Examiner—Richard A. Wintercorn
Attorney, Agent, or Firm—George J. Seligsohn

[57] ABSTRACT

An illumination system for use in a unit magnification optical projection system (such as a Half-Field Dyson system) is provided. In a Half-Field Dyson system, a reticle and a wafer are parallel to each other with a window being provided on the reticle to allow for projection of the reticle pattern onto the wafer. The present invention provides uniform bright illumination over the reticle pattern with little or no spill over through the reticle window.

25 Claims, 11 Drawing Sheets

ILLUMINATION SYSTEM FOR HALF-FIELD DYSON STEPPER

CROSS-REFERENCE TO RELATED APPLICATIONS

The present application is related to the following copending applications filed concurrently with the present application and assigned to the same assignee as the present application: Ser. No. 993,547, entitled "Focusing Technique Suitable for Use with an Unpatterned Specular Substrate"; Ser. No. 993,795, entitled "An Alignment System for a Half-Field Dyson Projection System"; and Ser. No. 994,238, entitled "System for Achieving a Parallel Relationship between surfaces of Wafer and Reticle of Half-Field Dyson Stepper".

BACKGROUND OF THE INVENTION

The present invention relates to a projection system for printing circuit patterns on photoresist coated wafers in semiconductor microlithography. It relates in particular to a class of projection system wherein a photoresist coated silicon wafer is covered with circuit patterns by sequentially exposing different areas of the wafer. Such a system is generally referred to as a step-and-repeat exposure system or simply a stepper.

The present invention relates more particularly to an illumination system for a unit magnification optical projection system for use in microlithography such as described in U.S. Pat. No. 4,964,705 which is assigned to the same assignee as the present invention, and the details of which are hereby incorporated by reference.

That unit magnification projection system is a unit magnification, achromatic, anastigmatic, optical projection system that uses both reflective and refractive elements in a complementary fashion, i.e., a catadioptric optical system, to achieve large field sizes and high numerical apertures. In that system the reticle and wafer are parallel with a window being provided on the reticle adjacent to the patterned area to allow for the projection of the reticle (mask) pattern through the reticle window onto the wafer. The unit magnification system is referred to as a Half-Field Dyson system for reasons which will be explained in detail in the present specification.

To use such a system in a stepper for semiconductor fabrication an accompanying illumination system is required. The above referenced unit magnification system employs a reflective reticle as opposed to transmissive reticles of prior art projection systems. As such, light may not be introduced into the projection system through the reticle. The light is preferably introduced into the system through an optical element of the projection system such that a well defined, uniformly illuminated area may be imaged on to the reflective reticle.

Desirably, the illumination system provides a uniform patch of illumination over the reticle pattern area with no spill over through the adjacent reticle window onto the wafer.

In view of the foregoing, there is a need for an improved illumination system for use with a unit magnification optical projection system.

SUMMARY OF THE INVENTION

The present invention is directed to an illumination system for a stepper employing a Half-Field Dyson projection system, whereby a wafer coated with a photoresist sensitive to radiation of a given wavelength may be exposed through a reticle window by an image of a pattern on a reticle that is illuminated with the radiation of the given wavelength.

More specifically, the illumination system comprises optical relay means that includes a light pipe of a certain aperture; a first relay portion for illuminating an input end of the light pipe with radiation of the given wavelength radiated from a radiation source that is remotely situated from the Half-Field Dyson projection system; and a second relay portion that (1) comprises the Half-Field Dyson projection system, (2) is illuminated with radiation of the given wavelength from an output end of the light pipe, and (3) provides substantially uniform bright illumination of the reticle pattern with radiation of the given wavelength without any significant spill over of the reticle-pattern illuminating radiation through the reticle window.

BRIEF DESCRIPTION OF THE DRAWING

FIG. 8a graphically illustrates relative energy distribution at the input end of the light pipe of FIG. 4a.

FIG. 8b graphically illustrates relative energy distribution at the output end of the light pipe of FIG. 4a.

DETAILED DESCRIPTION OF THE PREFERRED EMBODIMENTS

Reference will now be made in detail to the preferred embodiments of the invention, examples of which are illustrated in the accompanying drawings. While the invention will be described in conjunction with the preferred embodiments, it will be understood that they are not intended to limit the invention to those embodiments. On the contrary, the invention is intended to cover alternatives, modifications and equivalents, which may be included within the spirit and scope of the invention as defined by the appended claims.

Figure 1:
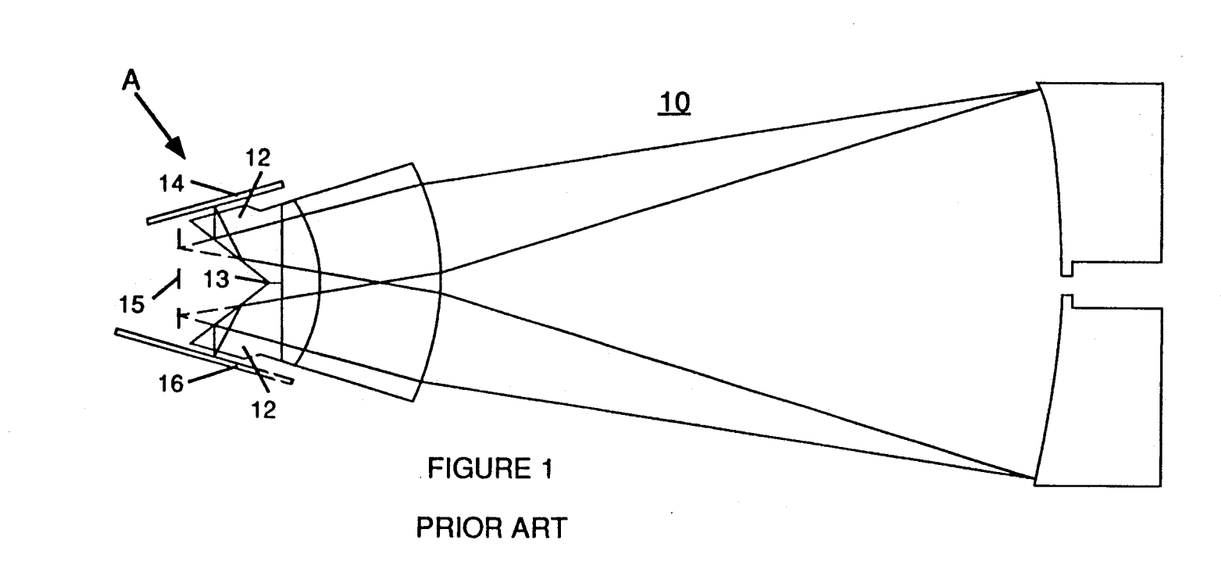
FIG. 1 depicts a Folded Wynne Dyson Projection System.

Referring to FIG. 1, a diagram of a typical previous implementation of a folded Wynne-Dyson projection system 10 is shown. The Wynne-Dyson optical elements include folding prisms 12, having an apex 13, to separate the object and image planes which would otherwise be superimposed at a focal plane 15. The prisms 12 separate the circular field into two symmetrical halves which become object and image planes or reticle and wafer fields 14 and 16. A folded Wynne Dyson system employs a transparent reticle. As such, illumination for the system may be directed into the system through reticle field 14 as indicated by arrow A.

Figure 1A:
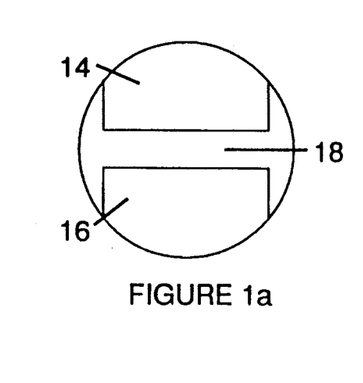
FIG. 1a depicts a small numerical aperture field format produced by the system of FIG. 1.
Figure 1B:
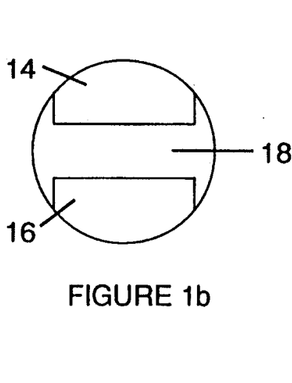
FIG. 1b depicts a medium numerical aperture field format produced by the system of FIG. 1.
Figure 1C:
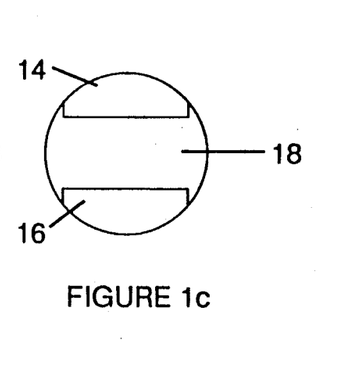
FIG. 1c depicts a large numerical aperture field format produced by the system of FIG. 1.

Prisms 12, used for separating reticle field 14 and wafer field 16, cause vignetting, i.e. loss of light, for rays which originate at or near the center of combined field of view 15. The vignetting causes a stripe 18 (See FIG. 1a), between reticle field 14 and wafer field 16 which cannot be used for imagery. It is well known in the art that the numerical aperture (NA) of a projection system must be increased in order to form smaller geometries or circuit features on a wafer. When the numerical aperture is increased, unfortunately, the width of the vignetted strip is also increased, thereby decreasing the proportion of field available for useful imagery. This is illustrated in FIGS. 1a, 1b, and 1c which show, respectively, the fields produced by small, medium and large numerical apertures. With a NA above 0.5, less than 25% of the total field would be available for imagery, rendering such a system impractical.

The subject matter of the present invention is a subsystem of a projection system which may be referred to as a Half-Field Dyson system. Half-Field Dyson or ½D is the name given to a new way of implementing a Wynne Dyson projection system. The system is described in detail in U.S. Pat. No. 4,964,705. It is a catadioptric system including refractive optical elements and reflective optical elements. Reflection and refraction properties may also be combined in a single optical element. With the ½D system, it is possible to achieve very high resolution over a large field and over a relatively broad spectral range with a very simple lens. The ½D system provides very nearly 50% of the total field available for imagery; thus the appellation Half-Field Dyson, ½D, or Half-Field Dyson means.

Figure 2:
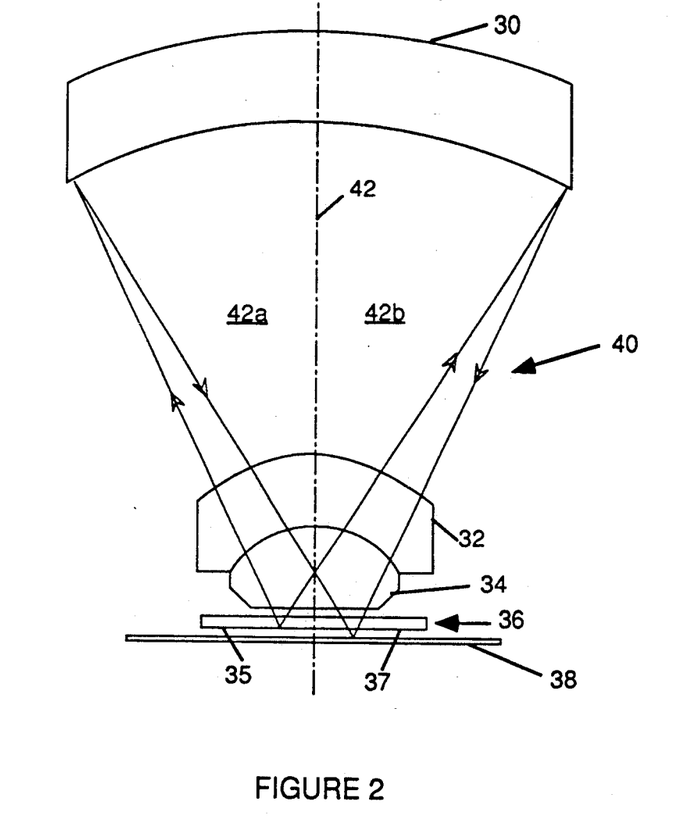
FIG. 2 depicts a Deep UV Half-Field Dyson Projection System
Figure 4:
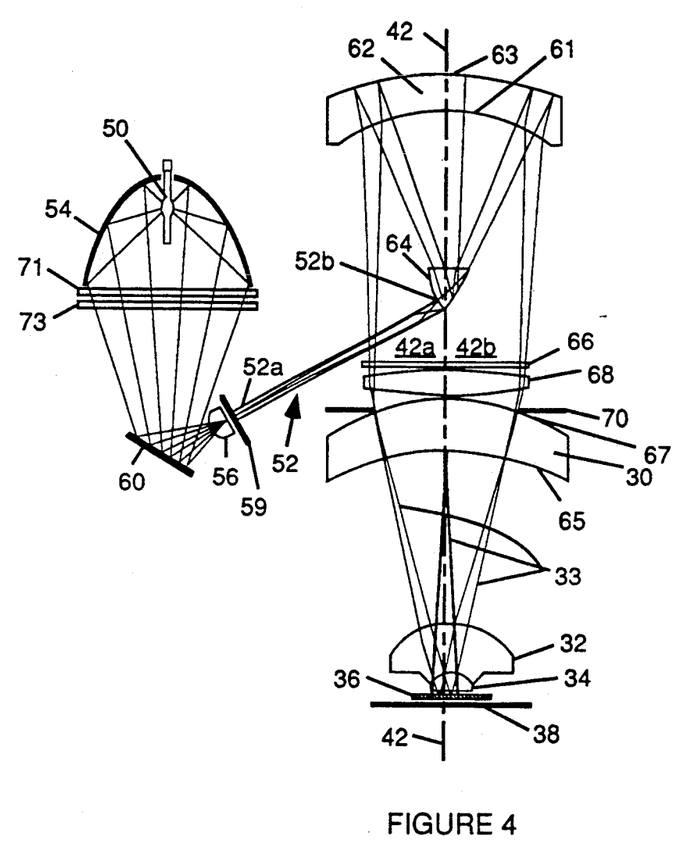
FIG. 4 depicts a Half-Field Dyson Illumination System and Projection System.
Figure 5:
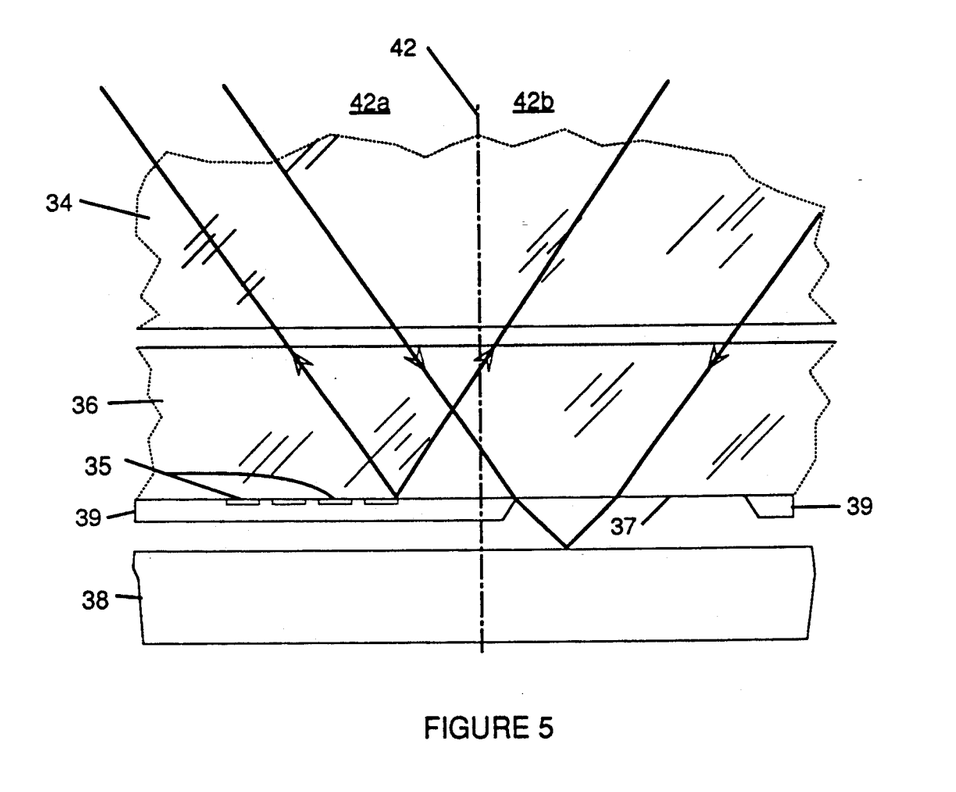
FIG. 5 depicts details of a reflective reticle and a wafer in the projection system of FIG. 4.
Figure 5A:
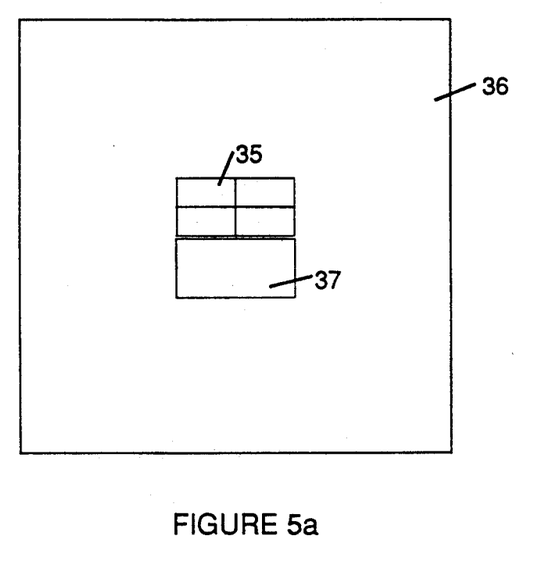
FIG. 5a depicts an arrangement of a reticle pattern and a window in the reticle of FIG. 5.

Referring now to FIG. 2 a diagram of a deep UV, Half-Field Dyson projection system is shown. The system 40 includes a primary lens-mirror 30, a thick meniscus or negative lens 32, a plano convex or positive lens 34, a reticle 36, and a wafer 38. The system optical axis is shown by dotted line 42. The axial position of reticle 36, i.e., the object plane, is adjusted such that the image plane on wafer 38 is located about one-hundred-fifty microns below reticle 36, and parallel to it. As shown in FIGS. 4 and 5, incoming exposure light is brought to focus on a reflective reticle pattern 35 located on one side 42a of optical axis 42 so that when the reticle 36 is imaged on the opposite side 42b of optical axis 42, the image forming light can pass through a window 37 in reticle 36 to wafer 38 located immediately below. To prevent any light from passing through reflective reticle pattern 35 to wafer 38, reticle 36 is coated with a thin, durable absorbing layer 39 (See FIG. 5) which can be processed to provide window 37 opposite reticle pattern 35 (See FIG. 5a).

There are a number of significant advantages with the ½D system 40 of FIG. 2. For example, a relatively small separation between reticle 36 and wafer 38 does not appreciably upset the symmetry of the system. Further, the mask 36 and wafer 38 are both located in a telocentric imaging region of the system. The small separation of reticle 36 and wafer 38, i.e. the focal planes of the system, does not affect the system pupil location, or add significant coma or other distortion.

Figure 3:
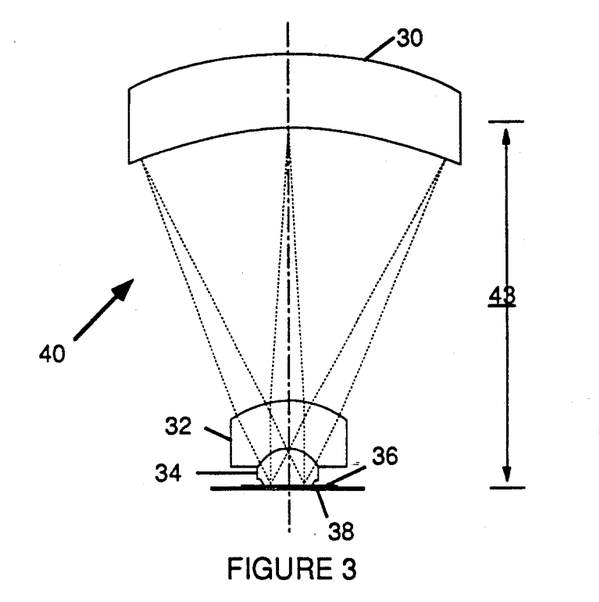
FIG. 3 depicts dimensions of one embodiment of the projection system of FIG. 2.
Figure 3A:
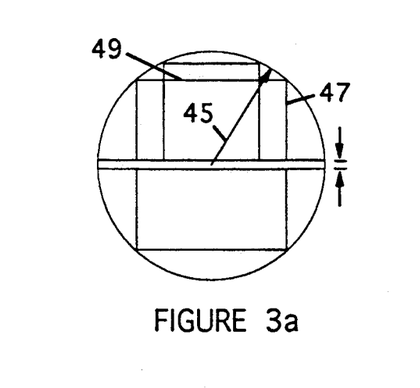
FIG. 3a depicts details of a field format provided by the system of FIG. 3.

Referring now to FIGS. 3 and 3a, a system having a separation 43 of about 600 millimeters (mm) between the primary lens-mirror 30 and reticle 36 and wafer 38 focal planes may provide a useful field radius 45 of about 29 mm. As such a rectangular pattern having a length 47 of about 20 mm and a width 49 of about 40 mm may be accommodated, even with a projection system numerical aperture as high as 0.7. Such a system illuminated by deep UV radiation, for example radiation having a wavelength of about 248 nanometers (nm) would easily resolve a 0.25 micron feature. A pattern projected by such a system may contain $1.28 \times 10^{10}$ such features in the field. This is more than an order of magnitude increase in feature count compared with prior art projection systems illuminated by the G (436 nm) or I (365 nm) lines of a mercury arc lamp.

Figure 7:
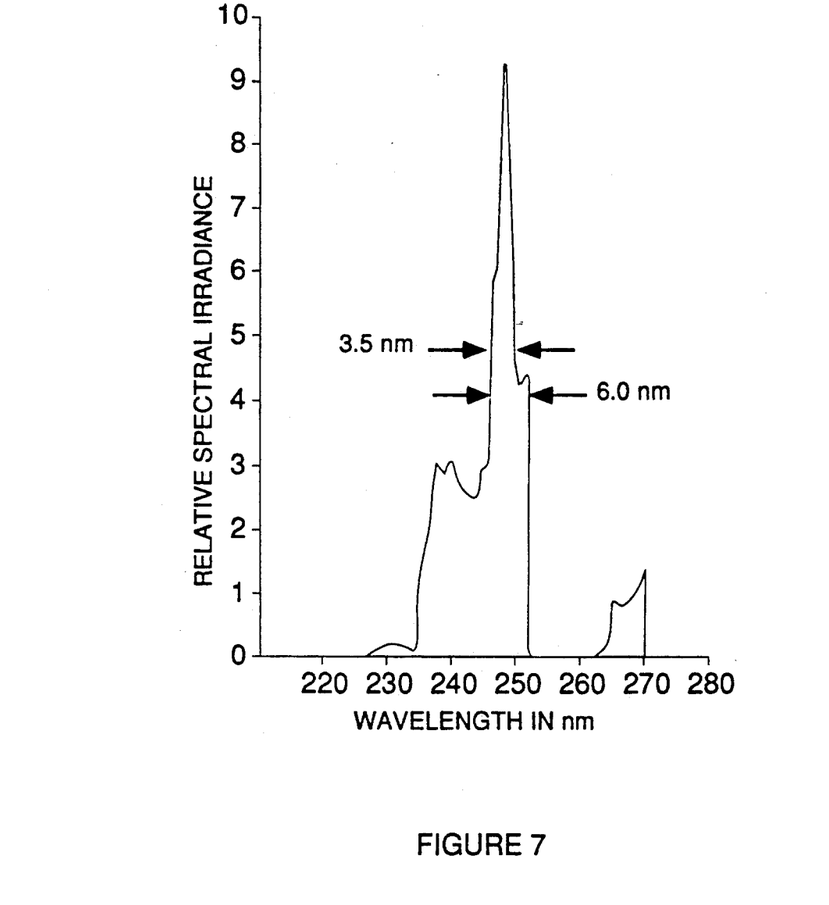
FIG. 7 is an output spectrum of a mercury arc lamp.

The system is sufficiently efficient that illumination may be provided by a mercury arc lamp, rather than an excimer laser which is generally used in prior art deep UV projection systems. In one embodiment, the ½D system may be illuminated by a 6 nanometer (nm) bandwidth spectral band having a center wavelength of about 248 nm. The band may be selected from the output spectrum of a conventional high pressure mercury arc lamp by an optical filter. FIG. 7 shows an output spectrum of a mercury arc lamp for wavelengths between about 220 and 270 nm. A narrow band optical filter having a bandwidth of about 6 nm may be used to isolate radiation peak B which is located at about 248 nm. A ½D projection system thus illuminated may require only a 100 millisecond (msec.) exposure time to properly expose a chemically amplified resist such as Shipley SNR 248 resist. Since the selected center wavelength of about 248 nm of the 6 nm bandwidth mercury lamp emission coincides in wavelength with the 248 nm center wavelength of the 1 nm bandwidth emission from a KrF excimer laser, a KrF excimer laser or a mercury lamp may be used interchangeably in the same system.

Another important advantage of the ½D system is low lens distortion. Low lens distortion is desirable so that the pattern laid down by one tool can be precisely overlaid by a pattern from a second tool. Because of the high degree of symmetry of the ½D system, the design distortion may be as low as about 10 nm. This is considerably smaller than the distortion likely to be introduced by normal fabrication and alignment errors in the optical elements. A careful analysis of the effect of such errors shows that there are very few error sources and the distortion due to all sources should generally be well below 30 nm in a Half-Field Dyson system. Low distortion will also greatly facilitate production in fabrication lines containing many tools since the close match between different optical systems eliminates the need to keep track of which wafers were exposed by which tool.

Returning to FIG. 3, the refractive elements of the projection system include two elements 32 and 34 with a small air space between them. The plano-convex lens element 34 closest to the focal plane may be made from calcium fluoride ($CaF_2$), and the thick meniscus element 32 may be made from fused silica. Both materials have good transmission at 248 nm. Calcium fluoride is a crystalline material that has been employed for many years in high power microscope objectives, and is readily obtained in the size required.

The numerical aperture of the Half-Field Dyson system may be readily altered, as may the scale of the system. The field diameter scales almost linearly with the radius of curvature of the primary lens-mirror 30. For example, a 300 mm radius primary yields a 30 mm diameter field and a 600 mm radius primary a 58 mm diameter (29 mm radius) field as described above. Designs having numerical apertures greater than 0.52 may include a weak aspheric surface on the primary lens-mirror 30 for removing high order spherical aberration. For a modestly sized 0.7 NA system, the aspheric surface may be about ⅓ of a micron departure from a sphere and may correspond to a rolled down edge on primary lens-mirror 30.

Referring to FIG. 4, an illumination system for the Half-Field Dyson projection system according to the present invention is shown. According to one aspect of the present invention, the illumination system includes an optical relay. The optical relay comprises a first relay portion that relays illumination from a light source remote from the ½D projection system into the input of a light pipe, and a second relay portion that relays illumination from the output of the light pipe into the ½D projection system In one embodiment of the first relay portion of the optical relay, light, i.e., ultraviolet radiation, from a mercury arc lamp 50 is imaged onto the end 52a of a light pipe 52 by an elliptical reflector 54, a fold mirror 60 (which is preferably a dielectric mirror) and an immersion lens 56. Light pipe 52 itself functions in much the same way as a kaleidoscope in that the input beam thereto from the first relay portion of the optical relay in passing through light pipe 52 is folded upon itself several times before it exits therefrom and is applied to the second relay portion of the optical relay. The immersion lens 56 changes the numerical aperture of the beam between reflector 54 and light pipe 52. This allows the beam in light pipe 52 to have a high NA and thus allows light pipe 52 to be thirty percent (30%) smaller than it would be without immersion lens 56. A shutter 59 for controlling exposure times, may be located between immersion lens 56 and light pipe 52. This location is preferred because of the small size of the light beam therein.

A laser, such a KrF excimer laser, may be used as a light source instead of a mercury lamp. In such a case, elliptical reflector 54 and fold mirror 60 may not be necessary components of the first relay portion of the optical relay system because light radiated from a laser light source normally consists of a sufficiently small aperture collimated beam. This permits light from the laser beam to be directed immediately to a lens 97, as shown in FIG. 9, (or other type of optical element) for converting the collimated laser beam into a slightly diverging beam for travel through light pipe 52.

Figure 9:
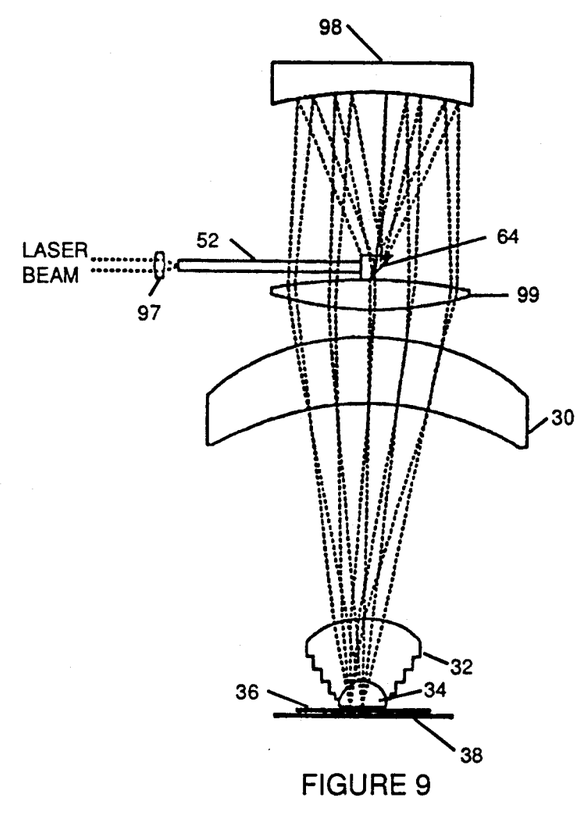
FIG. 9 depicts a Half-Field Dyson Illumination System and Projection System employing a laser light source.

The purpose of the second relay portion of the illumination system optics shown in FIGS. 4 and 9 is to precisely image the output light emerging from light pipe 52, i.e., the light pipe exit face 52c (See FIG. 4a) at exit end 52b thereof, onto the reticle pattern 35. The reticle pattern 35 requires uniform bright illumination with no spillover of the illumination onto reticle window 37. It is important that no light from the illumination system pass directly through reticle window 37. The window 37 is only to be used by the ½D projection system, for example, as depicted in FIG. 5, to re-image the reticle pattern onto the wafer via primary lens-mirror 30. The required crisp imaging of the light emerging from pipe exit face 52c is accomplished by the elements of the second relay portion of the optical relay, which, in FIG. 4, include Mangin mirror 62, fold prism 64, narrow band filter 66, focus lens 68, and pupil stop 70. Mangin mirror 62, focus lens 68, primary lens-mirror 30, meniscus lens 32 and plano-convex lens 34 are substantially coaxial with system optical axis 42. If a laser is used, the Mangin mirror may be replaced with a simpler front surface mirror 98. This is illustrated in FIG. 9.

Light pipe 52, Mangin mirror 62 in FIG. 4 or front surface mirror 98 in FIG. 9, fold prism 64, focus lens 68 in FIG. 4 or aspheric focus lens 99 in FIG. 9, primary lens-mirror 30, negative lens 32 and positive lens 34 are important elements of the optical relay system and are required independent of the type of light source employed by the first relay portion of the relay system. Primary lens-mirror 30, negative lens 32 and positive lens 34 are elements which the second relay portion of relay system shares with the Half-Field Dyson system. Narrow band filter 66 may not be necessary if a laser is used as a light source.

Figure 4A:
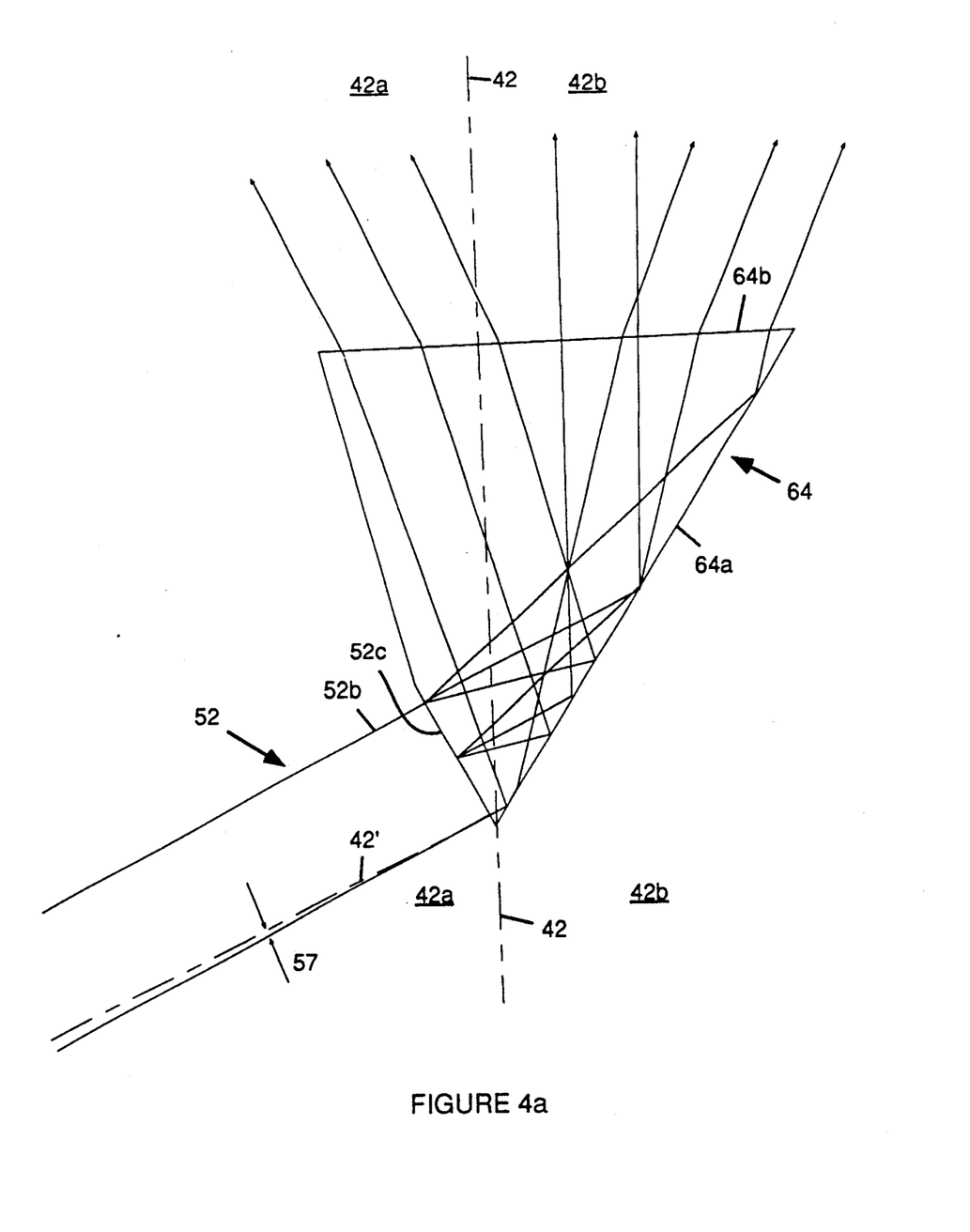
FIG. 4a depicts details of a light pipe and a fold prism of the illumination system of FIG. 4.
Figure 8:
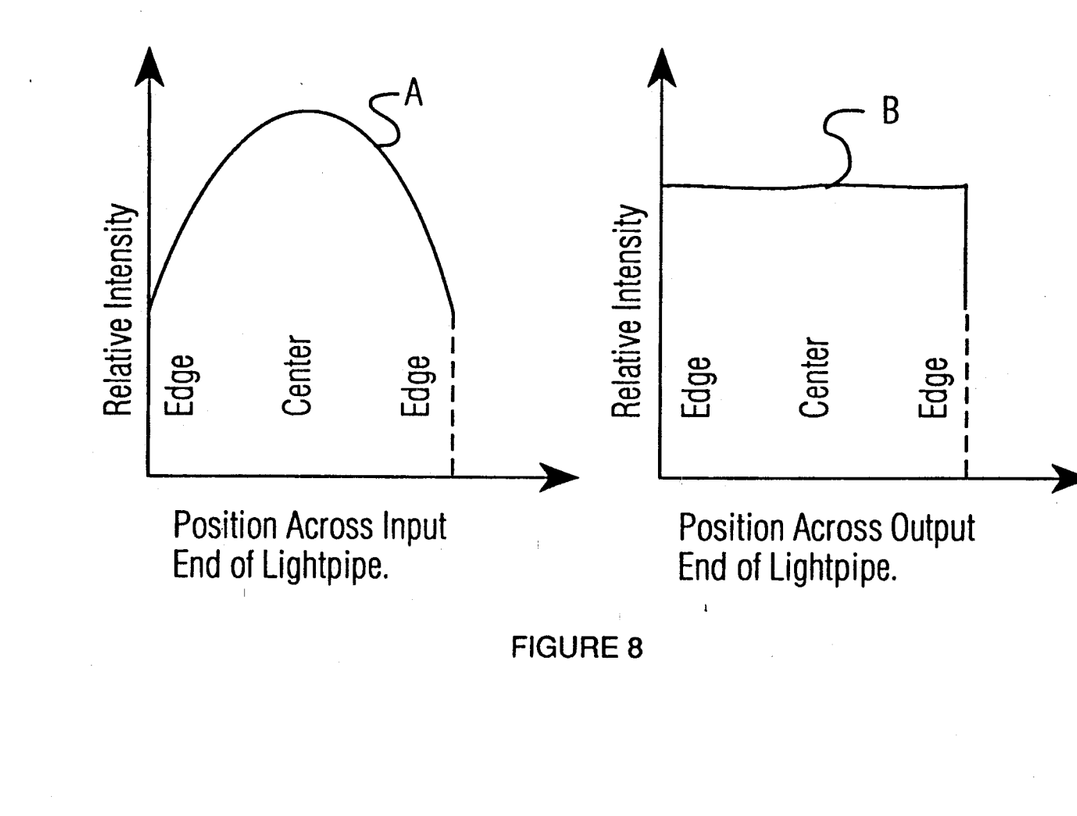

In FIG. 4, the image (not shown) of the arc of lamp 50 is nonuniform at the entrance 52a of light pipe 52. The distribution of intensity across entrance 52a may take the form illustrated by Curve A of FIG. 8a i.e., it may have a significantly higher intensity at the center of the entrance than at the edges. Multiple reflections down the length of light pipe 52 produce an exremely uniform image at end 52b (exit face 52c as illustrated in FIG. 4a) adjacent folding prism 64. This image may take the form illustrated by Curve B of FIG. 8b. The image is sufficiently uniform that it may provide a ±2% uniformity on reticle 36. The uniformity of the image is important in preserving accurate line widths in an image transferred to the wafer.

Returning now to FIG. 4, to reduce stray light generated by multiple reflections, it is desirable to minimize the number of optical elements between light pipe 52 and projection primary lens-mirror 30. Mangin mirror 62 is effective in that regard. Mangin mirror 62 is a catadioptric optical element combining properties of reflective and refractive optical elements. It includes a front surface 61 and a back surface 63. Front surface 61 may have a radius of curvature smaller than the radius of curvature of back surface 63 thereby providing negative refractive power. Back surface 63 includes a reflective coating which may be aluminum or a transparent dielectric film stack. Mangin mirror 62 comes close to producing collimated light.

The ½D projection system primary lens-mirror 30 includes a front surface 65 and a back surface 67. Back surface 67 has a smaller radius of curvature than front surface 69, thereby providing positive refractive power for light transmitted therethrough. The nearly-collimated light from Mangin mirror 62 is brought to focus, on pattern 35 of reticle 36, by focus lens 68 and the refractive power provided by surfaces 65 and 67 of primary lens-mirror 30. Primary lens-mirror 30 thus forms part of the the second relay portion of the optical relay system as well as part of the ½D projection system. As such, the Mangin mirror based second relay portion of the relay system provides the required high definition imaging at the reticle focal plane with a minimal number of optical surfaces. The negative refractive power of Mangin mirror 62 also complements the positive lenses in the illumination system by providing field curvature, spherical aberration, and color of opposite sign to the same aberrations produced by the positive lenses.

The second relay portion of the optical relay preferably includes an illumination stop 70 for controlling the illumination on reticle 36 and wafer 38. The illumination stop 70, ideally, should be at a pupil position near front surface 65 of primary lens-mirror 30. Locating a stop in front of primary lens-mirror 30, however, would not be practical, as it would interfere with the reflective function of the primary mirror. In one embodiment, stop 70 may be located adjacent to back surface 67 of primary lens-mirror 30. Such a stop location provides a practical compromise compared with the ideal location.

The spectral irradiance at the wafer in a system illuminated with 248 nm radiation from a mercury lamp, such as shown in FIG. 4, may be about 70 milliwatts per square centimeter (mW/cm2). Since the sensitivity of most deep UV resists is generally between about 30 and 50 millijoules per square centimeter (mJ/cm2), the exposure times (for wafers coated with such resists) in such a system may be between about 430 and 714 milliseconds (msec).

As discussed above, in the case in which mercury lamp 50 is employed as the light source, the ½D projection system is preferably illuminated with optical radiation having a bandwidth of about 6 nm around a wavelength of about 248 nm. As such, any other radiation entering the system may not be useful, and may produce thermal and optical distortion in the illumination system and the projection system. Preferably unwanted radiation from mercury lamp 50 is limited or prevented from entering the illumination system and the projection system. Limiting the amount and wavelength of optical radiation entering the system may be referred to as spectral tailoring.

In the case in which a KrF excimer laser is employed as the light source, no spectral tailoring is required because substantially all of its optical radiation lies within a bandwidth of about 1 nm around a wavelength of about 248.5 nm. However, spectral tailoring, which may be achieved in a number of ways, is needed for a mercury lamp light source. For instance, in the embodiment shown in FIG. 4, spaced windows 71 and 73 may be located between elliptical reflector 54 and fold mirror 60, to isolate lamp 50 so it can be properly cooled, and to provide protection in the case of a lamp explosion. The window 71 may be formed from a material such as fused silica and coated with a dielectric filter which reflects wavelengths shorter than the desired wavelength. Window 71 is preferably coated with a thin film anti-reflection coating having a minimum reflection for the exposing wavelength band centered about 248 nm. Window 73 may be provided with a multilayer reflective coating for reflecting portions of the spectrum of the light source which are not used to expose the wafer. If fold mirror 60 is a dielectric mirror, as is preferred, it may be designed to act as a long wavelength pass filter for appreciably transmitting undesired longer wavelengths of the wavelength spectrum radiated by mercury lamp 50, while reflecting those desired spectrum wavelengths within the 6 nm bandwidth about 248 nm. Additional spectral tailoring may be achieved locating filter coatings on immersion lens 56 and reflective (back) surface 63 of Mangin mirror 62. The desired illumination bandwidth of about 6 nm for a mercury lamp may be provided by a narrow band filter 66. In order to function properly, narrow band filter 66 preferably should have light incident thereon only over a narrow range of incident angles centered around normal incidence. This may be provided by locating narrow band filter 66 between fold prism 64 and focus lens 68.

Referring now to FIG. 4a, light pipe 52 and fold prism 64 may be arranged such that total internal reflection occurs on face 64a of fold prism 64. This arrangement also simplifies integrating the illumination system into a practical, Half Dyson based stepper, as will be described in greater detail below.

Referring again to FIG. 4a, fold prism 64 is preferably located such that exit face 64b thereof is displaced to side 42b of system optical axis 42 so that the light pipe exit face image (not shown) on reticle 36 is displaced to side 42a of system optical axis 42. Fold prism 64 is also arranged such that light pipe 52 may be tilted at a relatively small angle 57, for example about one degree, from a reflected system optical axis 42'. This has been found to improve imagery of the light pipe exit face.

If an unnarrowed excimer laser is employed as the light source for exposure then considerable simplification is achieved. The first relay can be reduced to a single lens element 97 as shown in FIG. 9 which converts the near collimated output of the laser to a diverging beam (or a converging and subsequently diverging beam) which has the desired numerical aperture so it can be introduced to the input end of the light pipe. To prevent breakdown of the glass in the light pipe or arcing in the air path it is usually necessary to avoid bringing the beam to a good focus. This can be done by using a positive lens 97, shown in FIG. 9, having a great deal of spherical aberration or possibly a negative lens instead. The narrow spectral range of the laser can also simplify the second relay by eliminating or simplifying the filter and by replacing the Mangin mirror, shown in FIG. 4, with a simple spherical front surface mirror 98, shown in FIG. 9. This simplification is offset somewhat by the need to use at least one aspheric surface on the focus lens 99, shown in FIG. 9.

In a ½D system light from the illumination system is preferably transmitted through primary lens-mirror 30. System primary lens-mirror 30 must also reflect light from reticle 36 to wafer 38. As such, the reflective coating on surface 65 of primary lens-mirror 30 must be partially reflective and partially transmissive. A partially reflective coating may be formed, for example, by a three layer, hard, dielectric coating stack. Such a coating may produce a transmission value of about 50% and a reflection value of about 50%, at a wavelength of about 248 nm. These values of reflection and transmission are a preferred combination for the illumination and projection systems.

With the exception of elliptical reflector 54, all of the above-described illumination system elements of the optical relay are preferably made of fused silica. This includes projection system primary lens-mirror 30 which provides an important refractive element in the optical relay of the illumination system.

Figure 6:
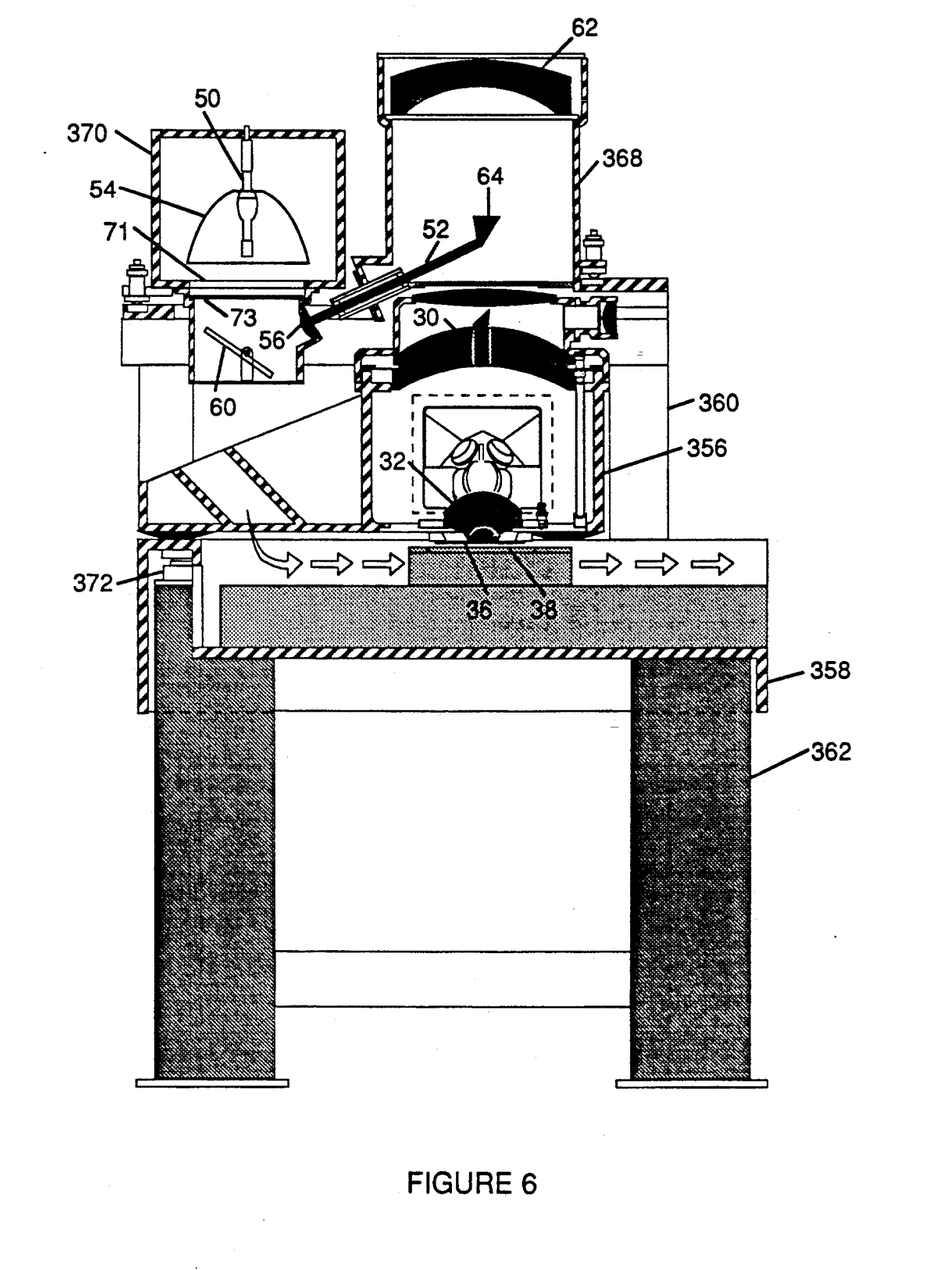
FIG. 6 depicts an illumination system and a Half Dyson Projection system packaged in a stepper.

Referring to FIG. 6, a sectional view of a stepper including a ½D projection system and the illumination system of the present invention is shown. The stepper includes a mechanical support system which allows relatively simple manufacturing assembly and optical component alignment. The mechanical structure of the stepper comprises two castings forming a lens housing 356 and a machine base 358. The structure also includes one large weldment 360 which forms a platform for an illumination system including optics housing 368 and a lamp housing 370. The lamp housing 370 may include windows 71 and 73 as shown. The stepper is supported on a support frame 362 which preferably includes an integrated active vibration control system.

The lens housing casting 356 serves as a common structure to mount the Half-Field Dyson optical components of the systems respectively described in this and each of the aforesaid cross-referenced related applications, as well as the reticle stage and the wafer stage metrology components.

Again, referring to FIG. 6, the illuminator relay and lamp chamber are supported by weldment 360 which maintains the relay system illumination optics and shutter in proper alignment without a direct connection between the illuminator and the projection lens housing. The weldment 360 also permits the illumination system to be assembled, aligned, and tested as a stand-alone module before it is attached to the base. Lamp housing 370 is located near the top of the system to put a minimum heat load on a temperature control system, not shown for the ½D system projection optics, and to provide quick access to the lamp housing 370. Soft vibration isolators 372, located between the base casting 358 and support frame 362, provide an isolated platform on which to mount the ½D system and the illumination system.

An invention comprising an illumination system for a Half-Dyson projection system has been described. The illumination system includes an optical relay system for relaying light from a light source into the Half-Dyson projection system. Desirable features of the optical relay system include an immersion lens (Q) and a light pipe for achieving a uniformly illuminated area. Other relay system features include using a Mangin mirror and optical elements of the Half-Dyson system as optical elements of the relay system. The number of elements in the illumination system is thereby minimized, reducing the possibility of image contrast loss due to ghost reflections.

Relay system elements may also include optical filters for removing unwanted radiation produced by the light source. Unwanted wavelengths which are poorly imaged by the projection optical system may thereby be minimized, thus reducing the possibility of degraded imagery.

The foregoing descriptions of specific embodiments of the present invention have been presented for purposes of illustration and description. They are not intended to be exhaustive or to limit the invention to the precise forms disclosed, and it should be understood that many modifications and variations are possible in light of the above teaching. The embodiments were chosen and described in order to best explain the principles of the invention and its practical application, to thereby enable others skilled in the art to best utilize the invention and various embodiments with various modifications as are suited to the particular use contemplated. It is intended that the scope of the invention be defined by the Claims appended hereto and their equivalents.

What is claimed is:

1. An illumination system for a stepper employing a Half-Field Dyson projection system, whereby a wafer coated with a photoresist sensitive to radiation of a given wavelength may be exposed through a reticle window by an image of a pattern on a reticle that is illuminated with said radiation of said given wavelength; said illumination system comprising optical relay means that includes:
   a light pipe of a certain aperture having an input end and an output end;
   a first relay portion for illuminating said input end of said light pipe with radiation of said given wavelength radiated from a radiation source that is remotely situated from said Half-Field Dyson projection system; and
   a second relay portion that (1) comprises said Half-Field Dyson projection system, (2) is illuminated with radiation of said given wavelength from said output end of said light pipe, and (3) provides substantially uniform bright illumination of said reticle pattern with radiation of said given wavelength without any significant spill over of said reticle-pattern illuminating radiation through said reticle window.

2. The illumination system defined in claim 1, further comprising said radiation source.

3. The illumination system defined in claim 2, wherein:
   the value of said given wavelength is substantially 248 nm;
   said radiation source comprises a mercury lamp that radiates a spectrum of wavelengths that includes a 6 nm bandwidth about 248 nm; and
   said optical relay means includes optical filter means for substantially transmitting wavelengths of said spectrum within said 6 nm bandwidth and substantially rejecting wavelengths of said spectrum outside of said 6 nm bandwidth.

4. The illumination system defined in claim 3, wherein:
   said light pipe has a relatively large numerical aperture;
   said radiation from said mercury lamp has a relatively small numerical aperture; and
   said first relay portion comprises an immersion lens for changing said relatively small numerical aperture substantially to said relatively large numerical aperture;
   whereby the cross section of said light pipe can be made substantially smaller than it could be made without said immersion lens.

5. The illumination system defined in claim 4, wherein:
   said immersion lens includes a filter coating thereon;
   whereby some portion of said filter means comprises said immersion-lens filter coating.

6. The illumination system defined in claim 4, wherein:
   said first relay portion further comprises optical means including an elliptical reflector for directing radiation from said mercury lamp to said immersion lens.

7. The illumination system defined in claim 6, wherein:
   said optical means further includes a fold mirror situated between said elliptical reflector and said immersion lens.

8. The illumination system defined in claim 7, wherein:
   said fold mirror is a dielectric mirror that reflects wavelengths of said spectrum of wavelengths within said 6 nm bandwidth about 248 nm, while appreciably transmitting wavelengths of said spectrum of wavelengths longer than those within said 6 nm bandwidth about 248 nm;

whereby some portion of said filter means comprises and dielectric mirror.

9. The illumination system defined in claim 6, wherein:

said optical means further includes at least one window located between said elliptical reflector and said immersion lens to isolate said mercury lamp;

whereby said window permits said said mercury lamp to be properly cooled, and provides protection in case said mercury lamp explodes.

10. The illumination system defined in claim 9, wherein:

said window is coated with material which appreciably absorbs wavelengths of said spectrum of wavelengths shorter than those of said 6 nm bandwidth about 248 nm and provides substantially minimum reflection for said wavelengths of said 6 nm bandwidth about 248 nm of said spectrum of wavelengths;

whereby some portion of said filter means comprises said window.

11. The illumination system defined in claim 10, wherein said optical means further include a pair of spaced windows located between said elliptical reflector and said immersion lens to isolate said mercury lamp.

12. The illumination system defined in claim 11, wherein:

that one of said pair of spaced windows situated closer to said immersion lens and further from said elliptical reflector is provided with a multilayer reflective coating for appreciably reflecting wavelengths of said spectrum of wavelengths that are not within said 6 nm bandwidth about 248 nm;

whereby said filter means comprises said one of said pair of spaced windows.

13. The illumination system defined in claim 12, wherein:

that other of said pair of spaced windows situated closer to said elliptical reflector and further from said immersion lens is coated with material which appreciably absorbs wavelengths of said spectrum of wavelengths shorter than those of said 6 nm bandwidth about 248 nm and provides minimum reflection for said wavelengths of said 6 nm bandwidth about 248 nm of said spectrum of wavelengths;

whereby said filter means comprises said other of said pair of spaced windows.

14. The illumination system defined in claim 3, wherein:

said second relay portion comprises a Mangin mirror that includes a spectrally selective reflective coating on a surface thereof;

whereby some portion of said filter means comprises said reflective coating on said surface of said Mangin mirror.

15. The illumination system defined in claim 14, wherein:

said second relay portion further comprises a narrow band filter for substantially transmitting wavelengths of said spectrum within said 6 nm bandwidth whereby some portion of said filter means comprises said narrow band filter.

16. The illumination system defined in claim 2, wherein:

said radiation source is a laser.

17. The illumination system defined in claim 16, wherein:

the value of said given wavelength is substantially 248.5 nm; and said laser is a KrF excimer laser that radiates a substantially 1 nm bandwidth wavelength spectrum about 248.5 nm.

18. The illumination system defined in claim 16, wherein:

said laser radiates a substantially collimated beam of radiation of said given wavelength having a numerical aperture that is small with respect to said certain numerical aperture desired at said light pipe; and said first relay portion includes optical means situated between said laser and the input end of said light pipe for converting said collimated laser beam into a diverging beam for travel through said light pipe.

19. The illumination system defined in claim 1, wherein said second relay portion further comprises:

a mirror situated substantially coaxial with the optical axis of said Half-Field Dyson projection system;

a fold prism shaped and positioned, with respect to both said output end of said light pipe and said mirror, for converting the radiation of said given wavelength emerging from said light pipe to a diverging beam of radiation which illuminates said mirror and is then converted by said mirror into a near-collimated reflected beam of said radiation that illuminates given optical means that includes a focus lens and said Half-Field Dyson projection system; and said given optical means, in response to illumination by said near-collimated reflected beam of said radiation, provides said substantially uniform bright illumination over said reticle pattern with radiation of said given wavelength without any significant spill over of said reticle-pattern illuminating radiation through said reticle window.

20. The illumination system defined in claim 19, wherein said mirror is a Mangin mirror.

21. The illumination system defined in claim 19, wherein said given optical means further comprises:

a pupil stop oriented substantially coaxial with the optical axis of said Half-Field Dyson projection system.

22. The illumination system defined in claim 21, wherein:

said Half-Field Dyson projection system includes a primary lens-mirror having respective front and back surfaces oriented substantially coaxial with the optical axis of said Half-Field Dyson projection system; and:

said pupil stop is situated adjacent to said back surface of said primary lens-mirror.

23. The illumination system defined in claim 21, wherein:

said Half-Field Dyson projection system includes lenses with net positive power oriented substantially coaxial with the optical axis of said Half-Field Dyson projection system that in combination with said focus lens introduce spherical and color aberrations in the radiation passing therethrough; and said mirror provides field curvature, spherical aberration, and color of opposite sign which substantially compensates for the aberrations produced by said positive lenses.

24. The illumination system defined in claim 1, wherein said optical relay means further includes:

a shutter for controlling the time and duration of exposure of said photoresist-coated wafer with said radiation of given wavelength.

25. The illumination system defined in claim 24, wherein:

said shutter is situated in proximity to said input end of said light pipe.

* * * * *